United States Patent
Maeda

(10) Patent No.: US 6,724,060 B2
(45) Date of Patent: Apr. 20, 2004

(54) SEMICONDUCTOR DEVICE WITH SOLID STATE IMAGE PICKUP ELEMENT

(75) Inventor: Atsushi Maeda, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/278,906

(22) Filed: Oct. 24, 2002

(65) Prior Publication Data

US 2003/0227064 A1 Dec. 11, 2003

(30) Foreign Application Priority Data

Jun. 7, 2002 (JP) .................................. 2002-167470

(51) Int. Cl.⁷ .............................................. H01L 27/14
(52) U.S. Cl. ..................... 257/431; 257/222; 257/225; 257/226
(58) Field of Search ................. 257/222, 225, 257/226, 431; 438/69, 70, 73, 369

(56) References Cited

U.S. PATENT DOCUMENTS 6,259,145 B1 * 7/2001 Connolly et al. ........... 257/431

FOREIGN PATENT DOCUMENTS

JP 11-135772 5/1999

* cited by examiner

Primary Examiner—Eddie Lee
Assistant Examiner—Thomas Magee
(74) Attorney, Agent, or Firm—McDermott, Will & Emery

(57) ABSTRACT

An N-type impurity diffusion region is formed in an element forming region surrounded by a field insulating film. In a region between an end portion of the N-type impurity diffusion region and an end portion of the field oxide film, a P-type impurity diffusion region is formed so as to contain an interface level present portion under a bird's beak portion. Thus, a PN junction is formed in a position distant from the interface level present portion. Therefore, even if a voltage is applied to the PN junction, a depletion layer will not reach the interface level present portion. Consequently, a semiconductor device, which suppresses an occurrence of a leakage current along the lower surface of an element isolation insulating film caused by the interface level present portion undesirably included in the depletion layer, as well as a manufacturing method of the same can be obtained.

1 Claim, 10 Drawing Sheets

SEMICONDUCTOR DEVICE WITH SOLID STATE IMAGE PICKUP ELEMENT

BACKGROUND OF THE INVENTION

1. Field of the Invention

The present invention relates to a semiconductor device including an element isolation insulating film for isolating an element forming region and a manufacturing method thereof.

2. Description of the Background Art

Conventionally, as an example of a semiconductor device having an element isolation insulating film, a semiconductor device having a solid-state image pickup element has been used. In the following, a conventional semiconductor device will be described, in conjunction with the semiconductor device having the solid-state image pickup element.

FIG. 20 shows a circuit configuration of the solid-state image pickup element having a CMOS (Complementary Metal Oxide Semiconductor) type image sensor. As shown in FIG. 20, the solid-state image pickup element has a unit pixel or a unit cell C arranged in matrix. In addition, in the solid-state image pickup element, each of unit cells C is connected to a vertical shift register VS and a horizontal shift register HS.

Each unit cell C has a photodiode PD, a transfer switch M1, a reset switch M2, an amplifier M3 and a selection switch M4. Photodiode PD attains a function corresponding to a photoelectric conversion and storage portion converting incident light to electric charges and storing the resultant charges. Transfer switch Ml attains a function to transfer the charges to amplifier M3.

Transfer switch M1 is controlled by a signal from vertical shift register VS. Reset switch M2 resets photodiode PD by providing the stored charges to a ground electrode. Amplifier M3 amplifies the magnitude of an electrical signal generated by transferring the charges. When selection switch M4 is selected by the vertical shift register and a horizontal shift register, a source region is electrically connected to a drain region, and selection switch M4 outputs an electrical signal to the outside.

Here, each of transfer switch M1, reset switch M2, amplifier M3 and selection switch M4 is fabricated with a MOS transistor.

FIG. 21 is a top view showing a specific configuration of a region R in FIG. 20, and FIG. 22 is a cross-sectional view along the line XXII—XXII in FIG. 21.

As shown in FIGS. 21 and 22, on the surface of a P-type semiconductor substrate 102, an element isolation insulating film 103 is formed with LOCOS (LOCal Oxidation of Silicon). Further, on the surface of P-type semiconductor substrate 102, photodiode PD, transfer switch M1 and reset switch M2 are arranged side by side.

Photodiode PD is fabricated by a PN junction of P-type semiconductor substrate 102 with an N-type impurity diffusion region (an N-type active region) 104. In the upper portion of N-type impurity diffusion region 104 (in the vicinity of surface of P-type semiconductor substrate 102), a P-type impurity diffusion region (a P-type active region) 105 is formed. P-type impurity diffusion region 105 is formed to such a depth that a depletion layer of the PN junction of P-type semiconductor substrate 102 with N-type impurity diffusion region 104 will not reach the lower surface of P-type impurity diffusion region 105.

Transfer switch M1 has an N-type source region 104, an N-type drain region (an N-type active region, represented as FD (Floating Diffusion) because it sometimes floats during operation) 106a and a gate electrode layer 108a. N-type source region 104 and N-type drain region 106a are formed in P-type semiconductor substrate 102, spaced apart from each other by a prescribed distance. Gate electrode layer 108a is formed on a gate insulating layer 107 above a portion lying between N-type source region 104 and N-type drain region 106a in P-type semiconductor substrate 102.

Note that N-type impurity diffusion region 104 of photodiode PD and N-type source region 104 of transfer switch M1 represent the same region, and that they are merely called differently, from the viewpoint of each element.

Reset switch M2 has a pair of N-type source/drain regions 106a and a gate electrode layer 108b. The pair of N-type source/drain regions 106a are formed on the surface of semiconductor substrate 102, spaced apart from each other by a prescribed distance. Gate electrode layer 108b is formed on a gate insulating layer (not shown) above a region lying between the pair of N-type source/drain regions 106a.

Note that N-type drain region 106a of transfer switch M1 and one of N-type source/drain regions 106a of reset switch M2 represent the same region, and that they are merely called differently, from the viewpoint of each element.

As shown in FIG. 22, N-type drain region 106a, which is a floating diffusion region FD of the solid-state image pickup element, is in contact with an end portion of an element isolation insulating film 103. A stress is produced in the end portion of element isolation insulating film 103 due to an action in forming the same. The stress produces an interface level (an interface state) in the end portion in a direction parallel to the main surface of P-type semiconductor substrate 102 of element isolation insulating film 103.

In addition, a depletion layer is formed in the PN junction where N-type drain region 106a and P-type semiconductor substrate 102 are joined. If the depletion layer contains a portion where an interface level of the end portion of element isolation insulating film 103 is present, a leakage current is produced along a lower surface of element isolation insulating film 103. The produced leakage current will lower the performance of the solid-state image pickup element.

A problem caused in the floating diffusion region of the solid-state image pickup element will be described more specifically, with reference to FIGS. 23 and 24. In FIG. 23, only an N-type impurity diffusion region 205 as the floating diffusion region of the solid-state image pickup element and a field oxide film 202 as the element isolation insulating film formed by oxidation of the main surface of a P-type semiconductor substrate 201 are shown.

As shown in FIG. 23, field oxide film 202 is formed to a prescribed height and depth above and under the main surface of P-type semiconductor substrate 201. N-type impurity diffusion region 205 is formed in an element forming region surrounded by field oxide film 202. As shown in FIG. 24, N-type impurity diffusion region 205 is formed by impurity injection to the main surface of P-type semiconductor substrate 201, using field oxide film 202 as a mask.

Therefore, an end portion of field oxide film 202 is in contact with an end portion of N-type impurity diffusion region 205. Accordingly, as shown in FIG. 23, the PN junction formed with P-type semiconductor substrate 201 and N-type impurity diffusion region 205 will contact the end portion of field oxide film 202, that is, what is called a "bird's beak" portion 202a.

Consequently, a depletion layer 210 formed in the vicinity of the PN junction contains an interface level present portion. Therefore, the leakage current caused by a level at an interface of bird's beak portion 202a with N-type impurity diffusion region 205 and P-type semiconductor substrate 201 will be produced, resulting in lower performance of the solid-state image pickup element.

SUMMARY OF THE INVENTION

An object of the present invention is to provide a semiconductor device, which suppresses an occurrence of a leakage current caused by a portion, undesirably included in a depletion layer, where a level is present in an interface of an element isolation insulating film with a semiconductor substrate, and a manufacturing method of the semiconductor device.

A semiconductor device according to the present invention includes a first impurity diffusion region provided in a semiconductor substrate and including at least one impurity diffusion region having an impurity of a first conductivity type; an element isolation insulating film provided in the first impurity diffusion region and isolating one element forming region from another element forming region; and a second impurity diffusion region provided in the first impurity diffusion region and including at least one impurity diffusion region having an impurity of a second conductivity type. The second conductivity type is opposite to the first conductivity type.

In addition, the semiconductor device according to the present invention has an interface level present portion in which a level is produced in an interface where the element isolation insulating film and the semiconductor substrate are in contact.

Further, a position of an interface between the first impurity diffusion region and the second impurity diffusion region is set such that a depletion layer formed to contain the interface between the first impurity diffusion region and the second impurity diffusion region does not reach the interface level present portion.

With the above configuration, an occurrence of a leakage current caused by the interface level present portion undesirably included in the depletion layer during an operation of the semiconductor device is suppressed.

A manufacturing method of a semiconductor device according to the present invention includes a first step of forming in a semiconductor substrate, a first impurity diffusion region including at least one impurity diffusion region having an impurity of a first conductivity type; a second step of forming in the first impurity diffusion region, an element isolation insulating film isolating one element forming region from another element forming region; and a third step of forming in the first impurity diffusion region, a second impurity diffusion region including at least one impurity diffusion region having an impurity of a second conductivity type. The second conductivity type is opposite to the first conductivity type.

After the first to third steps are finished, an interface level present portion is formed, in which a level is produced in an interface where the element isolation insulating film and the semiconductor substrate are in contact. In addition, a position of an interface between the first impurity diffusion region and the second impurity diffusion region is set such that a depletion layer formed to contain the interface between the first impurity diffusion region and the second impurity diffusion region does not reach the interface level present portion.

According to the above manufacturing method of the semiconductor device, the semiconductor device as described above can be manufactured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, a semiconductor device according to embodiments of the present invention and a manufacturing method thereof will be described with reference to drawings.

Embodiment 1

Figure 1:
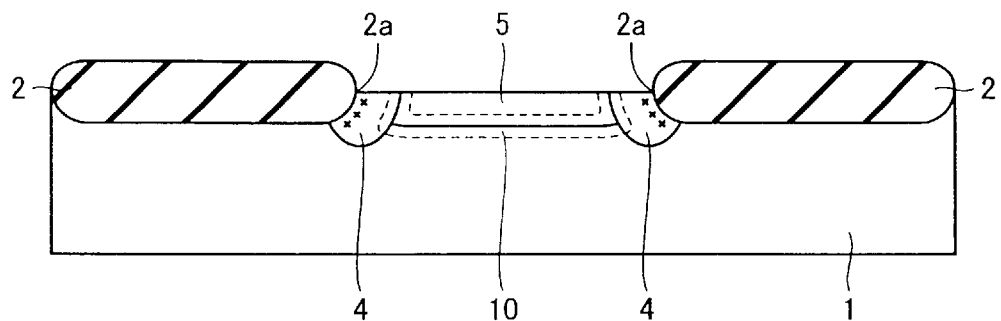
FIG. 1 illustrates a configuration of a semiconductor device in Embodiment 1.
Figure 20:
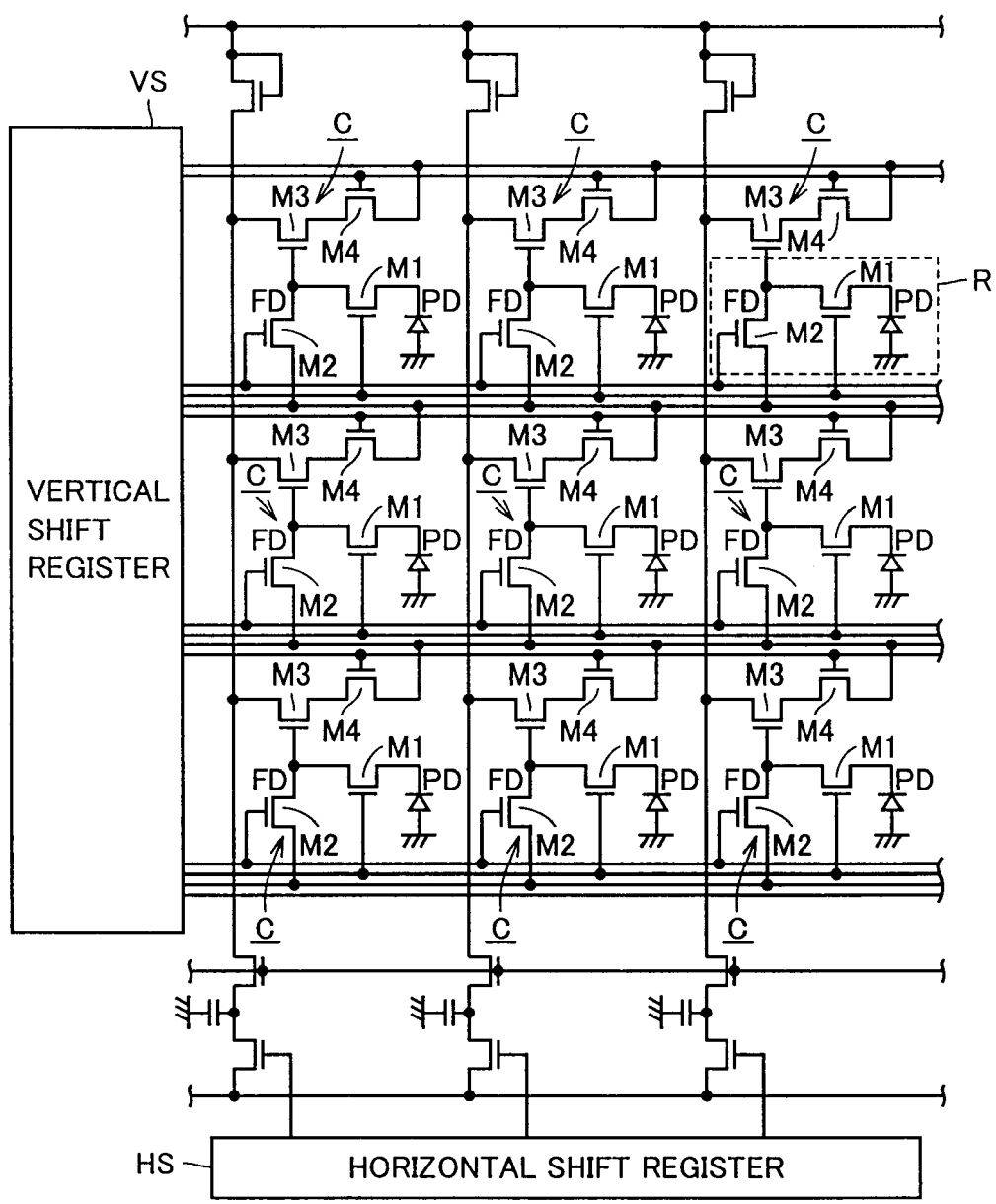
FIG. 20 shows a circuit configuration of a semiconductor device having a CMOS type image sensor as a solid-state image pickup element.
Figure 21:
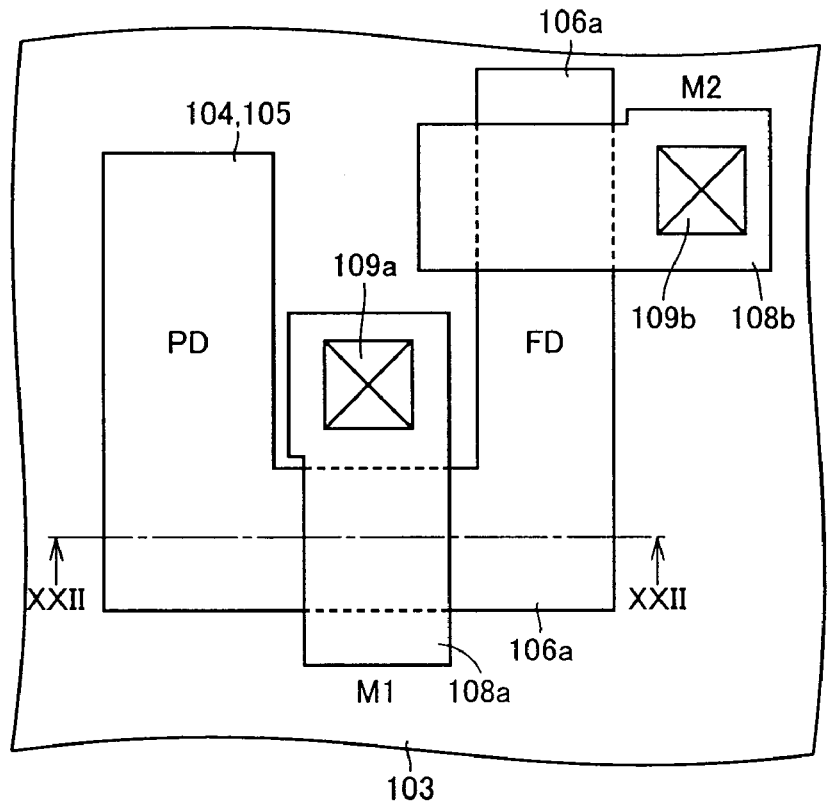
FIG. 21 is a top view showing a specific configuration of a region R in FIG. 20.
Figure 22:
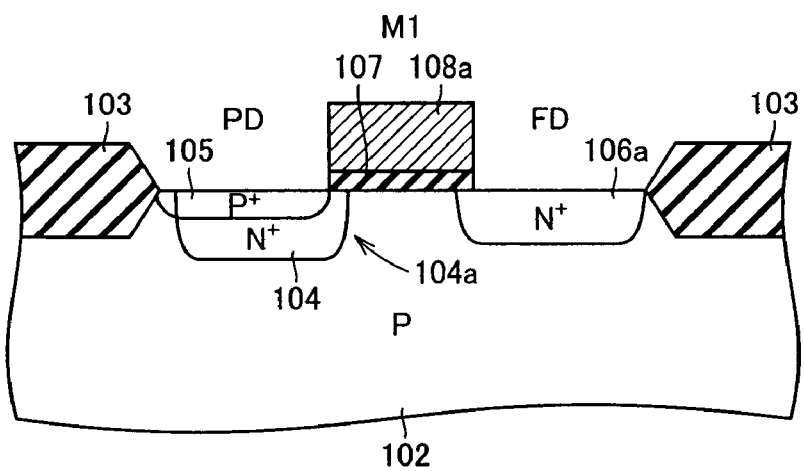
FIG. 22 is a cross-sectional view along the line XXII—XXII in FIG. 21.
Figure 23:
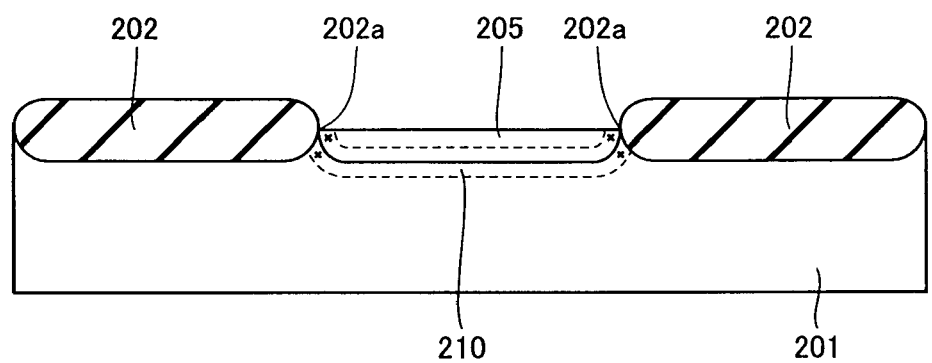
FIG. 23 illustrates a positional relation of an impurity diffusion region with an element isolation insulating film of a conventional semiconductor device.
Figure 24:
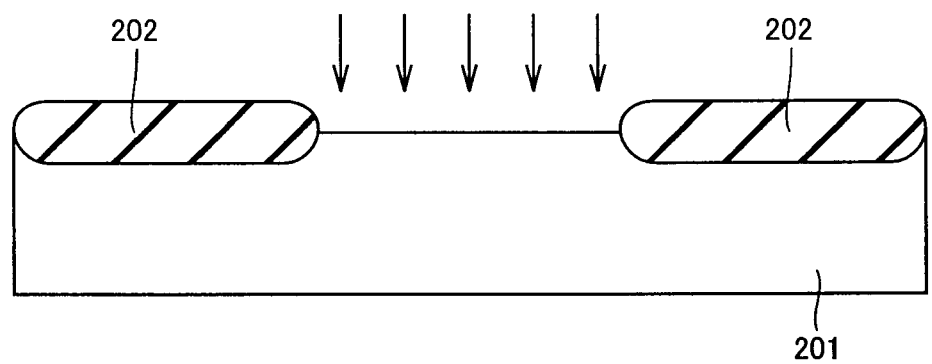
FIG. 24 illustrates formation of the impurity diffusion region in a semiconductor substrate, using a field oxide film as a mask, in a manufacturing method of the conventional semiconductor device.

First, referring to FIGS. 1 and 2, a semiconductor device in Embodiment 1 and a manufacturing method of the same will be described. In FIG. 1, only an N-type impurity diffusion region 5 as a floating diffusion region of a solid-state image pickup element and a field oxide film 2 as an element isolation insulating film formed by oxidation of the main surface of a P-type semiconductor substrate 1 are shown. Here, an overall configuration of the solid-state image pickup element is the same as that described with reference to FIGS. 20 to 22 in a conventional technique.

As shown in FIG. 1, in the solid-state image pickup element of the present embodiment, field oxide film 2 is formed in the vicinity of the main surface of P-type semiconductor substrate 1. A region surrounded by field oxide film 2 is provided as an element forming region.

An impurity is injected to the element forming region, using field oxide film 2 as a mask. Consequently, N-type impurity diffusion region 5 is formed. In a bird's beak portion 2a formed in an end portion in a direction parallel to the main surface of P-type semiconductor substrate 1 of field oxide film 2, an interface level is produced because of an action in oxidation of the main surface of P-type semiconductor substrate 1.

A portion where the interface level is produced is shown with a cross mark (x) in FIG. 1 (also in FIGS. 3, 6, 8, 11 and 14–18). In addition, on the lower surface side of bird's beak portion 2a, a $P^+$ type impurity diffusion region 4 (a $P^+$ type guard ring) containing a $P^+$ type impurity of a density higher than that of P-type semiconductor substrate 1 is formed so as to contain an interface level present portion.

According to the solid-state image pickup element of the present embodiment having the above-described configuration, $P^+$ type impurity diffusion region 4 is formed between an end portion of N-type impurity diffusion region 5 and element isolation insulating film 2. Therefore, as shown in FIG. 1, a PN junction includes an interface between $P^-$ type semiconductor substrate 1 and N-type impurity diffusion region 5 and an interface between $P^+$ type impurity diffusion region 4 and N-type impurity diffusion region 5, respectively. In other words, the PN junction is formed respectively along the interface between $P^-$ type semiconductor substrate 1 and N-type impurity diffusion region 5 and the interface between $P^+$ type impurity diffusion region 4 and N-type impurity diffusion region 5.

Therefore, a depletion layer produced by the PN junction is formed so as not to contact bird's beak portion 2a of field oxide film 2, as shown with a dashed line in FIG. 1. That is, a depletion layer 10 is formed in a region inside the end portions of the element forming region. Accordingly, depletion layer 10 does not reach the interface level present portion formed on the lower surface of bird's beak portion 2a. Consequently, an occurrence of a leakage current produced along the lower surface of field oxide film 2 is prevented, and the performance of the solid-state image pickup element can be improved.

Figure 2:
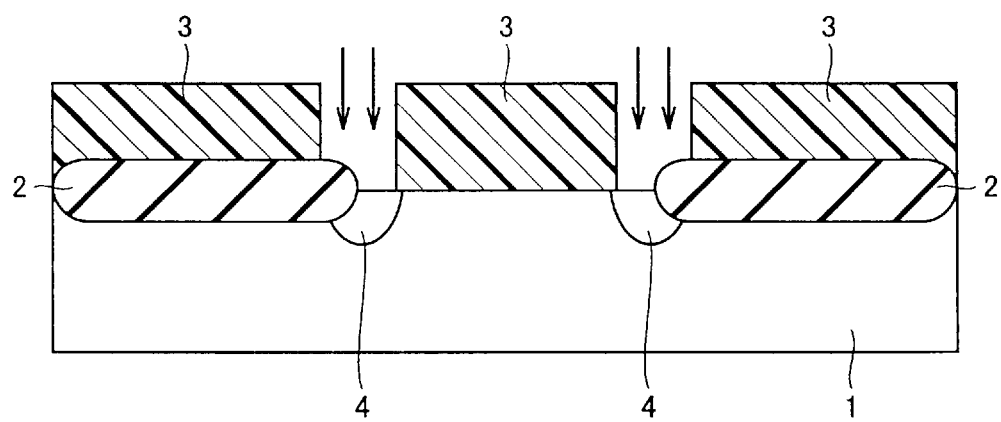
FIG. 2 illustrates a method of manufacturing the semiconductor device in Embodiment 1.

In the manufacturing method of the solid-state image pickup element of the present embodiment, as shown in FIG. 2, a resist film 3 is formed in that region on field oxide film 2, which is inside, by a prescribed distance, an end portion of field oxide film 2. In other words, the resist does not cover the vicinity of opposing sides of bird's beak portion 2a. Next, using resist film 3 as a mask, a $P^+$ type impurity is injected through field oxide film 2 so that the $P^+$ type impurity diffusion region is formed to a prescribed depth from the main surface of P-type semiconductor substrate 1. Thus, $P^+$ type impurity diffusion region 4 is formed.

Thereafter, resist film 3 is removed, and an N-type impurity is injected to the main surface of P-type semiconductor substrate 1, using field oxide film 2 as a mask. Thus, N-type impurity diffusion region 5 as shown in FIG. 1 is obtained. Here, though the N-type impurity is also injected to $P^+$ type impurity diffusion region 4, $P^+$ type impurity diffusion region 4 maintains P-type because of the high density of the $P^+$ type impurity thereof.

Embodiment 2

Next, referring to FIGS. 3 to 5, a semiconductor device in Embodiment 2 and a manufacturing method of the same will be described.

Figure 3:
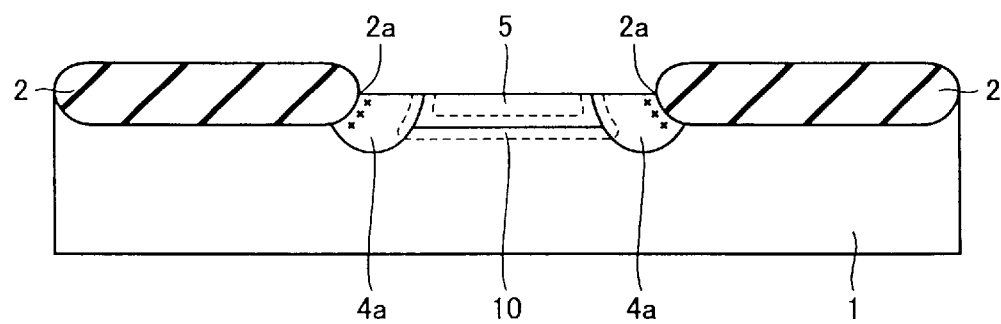
FIG. 3 illustrates a configuration of a semiconductor device in Embodiment 2.

As shown in FIG. 3, the solid-state image pickup element in Embodiment 2 has a configuration similar to that in Embodiment 1 shown in FIG. 1. There is a difference in configuration, however, between a $P^+$ type impurity diffusion region 4a and $P^+$ type impurity diffusion region 4 of the solid-state image pickup element in Embodiment 1 shown in FIG. 1.

According to the solid-state image pickup element shown in FIG. 3, depletion layer 10 containing the PN junction in accordance with the same principle as in the solid-state image pickup element in Embodiment 1 does not contain the interface level present portion produced on the lower side of bird's beak portion 2a. Therefore, the leakage current produced along the lower surface of field oxide film 2 is prevented, and the performance of the solid-state image pickup element is improved.

Next, the manufacturing method of the solid-state image pickup element shown in FIG. 3 will be described with reference to FIGS. 4 and 5.

Figure 4:
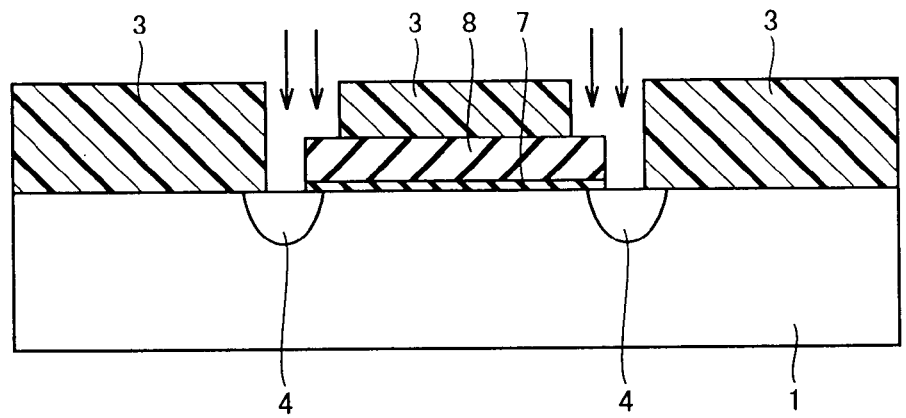
FIGS. 4 and 5 illustrate a method of manufacturing the semiconductor device in Embodiment 2.

In the manufacturing method of the solid-state image pickup element shown in FIG. 3, as shown in FIG. 4, initially, an underlying oxide film 7 with a film thickness of 100 Å is formed on the main surface of P-type semiconductor substrate 1. Then, a silicon nitride film 8 is formed on underlying oxide film 7. Next, resist film 3 is formed, extending outward from a position distanced by a prescribed amount from an end of silicon nitride film 8 and underlying oxide film 7. In addition, resist film 3 is formed in that region on silicon nitride film 8, which is inside the end portions of silicon nitride film 8.

Thereafter, in a state as shown in FIG. 4, using resist film 3, underlying oxide film 7 and silicon nitride film 8 as a mask, the $P^+$ type impurity of a density higher than the P-type impurity included in P-type semiconductor substrate 1 is injected to the main surface of P-type semiconductor substrate 1. Thus, $P^+$ type impurity diffusion region 4a is formed to a prescribed depth from the main surface of semiconductor substrate 1. Next, resist film 3 is removed.

Thereafter, using underlying oxide film 7 and silicon nitride film 8 remaining on the main surface of P-type semiconductor substrate 1 as a mask, the main surface of P-type semiconductor substrate 1 is subjected to thermal oxidation, to form field oxide film 2. Consequently, as shown in FIG. 5, a configuration can be obtained, in which P-type impurity diffusion region 4a is formed in the vicinity of the end portion in a direction parallel to the main surface of P-type semiconductor substrate 1 of field oxide film 2.

Figure 5:
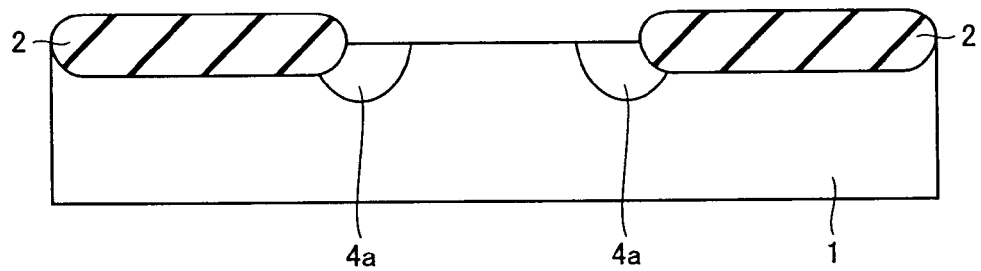

In the configuration shown in FIG. 5, using field oxide film 2 as a mask, the N-type impurity is injected to a prescribed depth from the main surface of P-type semiconductor substrate 1. Thus, the configuration shown in FIG. 3 is obtained.

Here, though the N-type impurity is also injected to $P^+$ type impurity diffusion region 4a, $P^+$ type impurity diffusion region 4a maintains P-type because of the high density of the P⁺ type impurity thereof.

Embodiment 3

Figure 6:
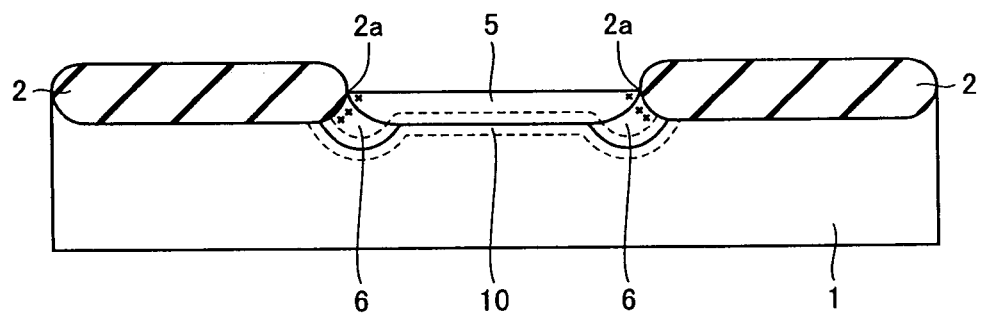
FIG. 6 illustrates a configuration of a semiconductor device in Embodiment 3.

Next, referring to FIGS. 6 and 7, a semiconductor device in Embodiment 3 and a manufacturing method of the same will be described. As shown in FIG. 6, in the solid-state image pickup element of the present embodiment, field oxide film 2 is formed in the vicinity of the main surface of P-type semiconductor substrate 1. Bird's beak portion 2a is formed in the end portion of field oxide film 2.

On the lower surface of bird's beak portion 2a, the interface level is present, produced in thermal oxidation. The portion where the interface level is produced is shown with a cross mark (x) in FIG. 6. In addition, in the element forming region surrounded by field oxide film 2, N-type impurity diffusion region 5 is formed. Further, an N⁺ type impurity diffusion region 6 (an N⁺ type guard ring) is formed so as to contact bird's beak portion 2a of field oxide film 2.

According to the configuration of the solid-state image pickup element of the present embodiment as described above, the PN junction is formed so as to include an interface between N⁺ type impurity diffusion region 6 and P-type semiconductor substrate 1 and an interface between N-type impurity diffusion region 5 and P-type semiconductor substrate 1, respectively. In other words, the PN junction is formed respectively along the interface between N⁺ type impurity diffusion region 6 and P-type semiconductor substrate 1 and the interface between N-type impurity diffusion region 5 and P-type semiconductor substrate 1. Consequently, depletion layer 10 does not reach bird's beak portion 2a. That is, depletion layer 10 does not contain the interface level present portion.

Therefore, in the solid-state image pickup element in the present embodiment as in Embodiments 1 and 2, the leakage current due to the interface level produced along the lower surface of bird's beak portion 2a is prevented. As a result, the performance of the solid-state image pickup element is improved.

Next, the manufacturing method of the solid-state image pickup element of the present embodiment will be described with reference to FIG. 7.

Figure 7:
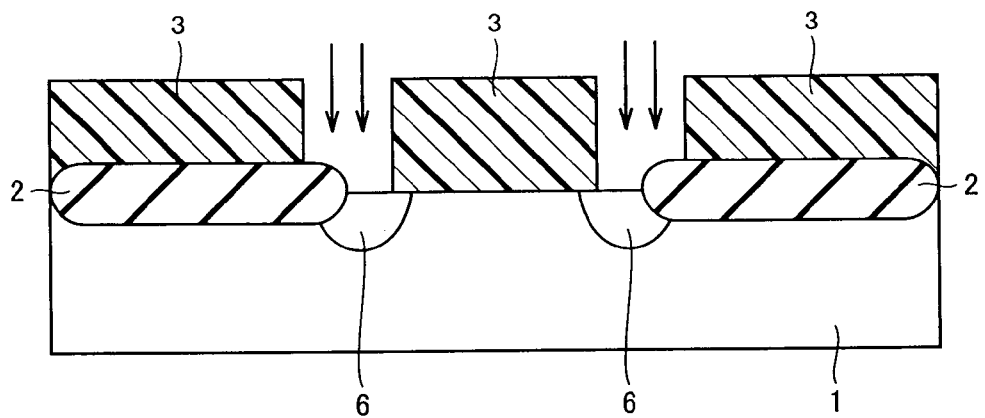
FIG. 7 illustrates a method of manufacturing the semiconductor device in Embodiment 3.

In the manufacturing method of the solid-state image pickup element in the present embodiment, as shown in FIG. 7, resist film 3 is formed in that region above field oxide film 2, which is inside, by a prescribed distance, the end portion of field oxide film 2.

Next, using resist film 3 as a mask, N⁺ type impurity diffusion region 6 of a density higher than that of the N-type impurity contained in N-type impurity diffusion region 6 is formed in the vicinity of the end portion of field oxide film 2. Thus, a configuration shown in FIG. 7 is obtained. Then, resist film 3 is removed. Thereafter, using field oxide film 2 as a mask, the N-type impurity is injected to a prescribed depth from the main surface of semiconductor substrate 1, to form N-type impurity diffusion region 5. Thus, a configuration shown in FIG. 6 is obtained.

Embodiment 4

Figure 9:
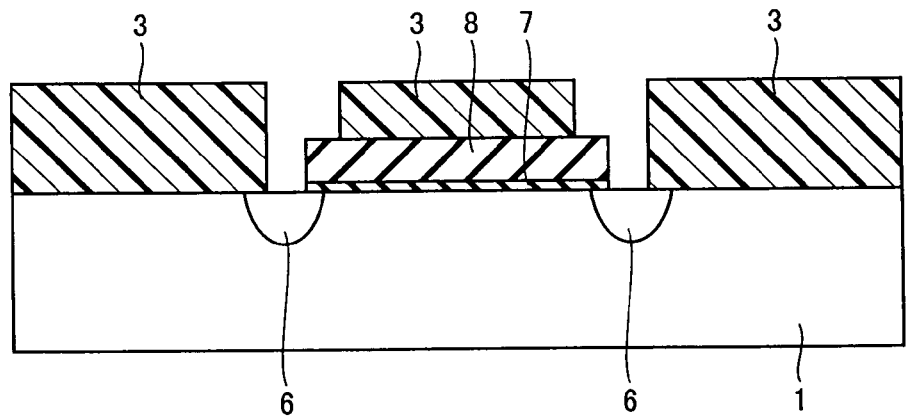
FIGS. 9 and 10 illustrate a method of manufacturing the semiconductor device in Embodiment 4.
Figure 10:
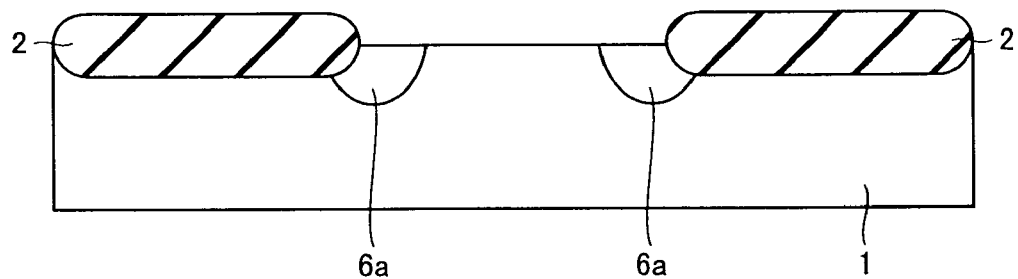

Next, referring to FIGS. 8 to 10, a semiconductor device in Embodiment 4 and a manufacturing method of the same will be described.

Figure 8:
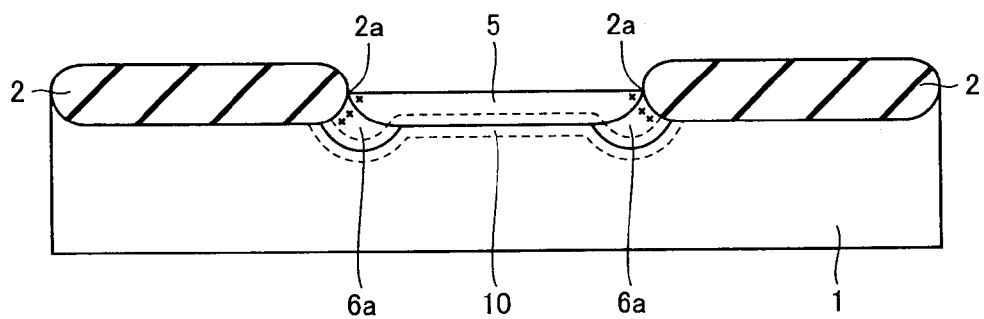
FIG. 8 illustrates a configuration of a semiconductor device in Embodiment 4.

As shown in FIG. 8, the solid-state image pickup element in the present embodiment has a configuration substantially similar to that in Embodiment 3 shown in FIG. 6. In the solid-state image pickup element shown in FIG. 8, however, the configuration of an N⁺ type impurity diffusion region 6a formed under bird's beak portion 2a of field oxide film 2 is different from that of N⁺ type impurity diffusion region 6 in the solid-state image pickup element in Embodiment 3 shown in FIG. 6.

Next, the manufacturing method of the solid-state image pickup element of Embodiment 4 will be described with reference to FIGS. 9 and 10.

In the manufacturing method of the solid-state image pickup element of the present embodiment, initially, underlying oxide film 7 with a film thickness of 100 Å is formed on the main surface of P-type semiconductor substrate 1. Then, silicon nitride film 8 is formed on underlying oxide film 7. Resist film 3 is formed in a region outside, by a prescribed distance, the end portion of silicon nitride film 8 and underlying oxide film 7.

Resist film 3 is also formed in that region on silicon nitride film 8, which is inside the opposing ends of the same. Next, using resist film 3, underlying oxide film 7 and silicon nitride film 8 as a mask, the N⁺ type impurity is injected to P-type semiconductor substrate 1, to form N⁺ type impurity diffusion region 6. Thus, a configuration shown in FIG. 9 is obtained.

Resist film 3 is then removed. Thereafter, using silicon nitride film 8 and underlying oxide film 7 as a mask, the main surface of P-type semiconductor substrate 1 is subjected to thermal oxidation, to form field oxide film 2. Thus, bird's beak portion 2a, which is the end portion of field oxide film 2, is formed so as to contact N⁺ type impurity diffusion region 6a, and a configuration shown in FIG. 10 is obtained.

Thereafter, underlying oxide film 7 and silicon nitride film 8 are removed. Using field oxide film 2 as a mask, the N-type impurity is injected to a prescribed depth from the main surface of semiconductor substrate 1, to form N-type impurity diffusion region 5. Thus, a configuration shown in FIG. 8 is obtained.

Embodiment 5

Figure 11:
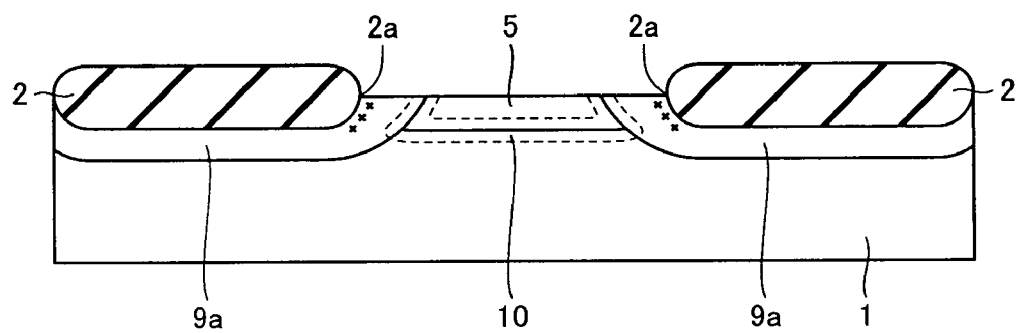
FIG. 11 illustrates a configuration of a semiconductor device in Embodiment 5.
Figure 12:
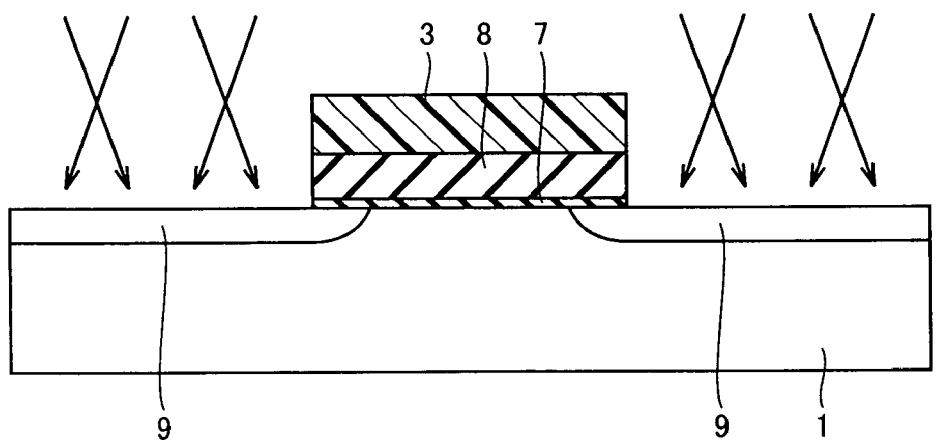
FIGS. 12 and 13 illustrate a method of manufacturing the semiconductor device in Embodiment 5.
Figure 13:
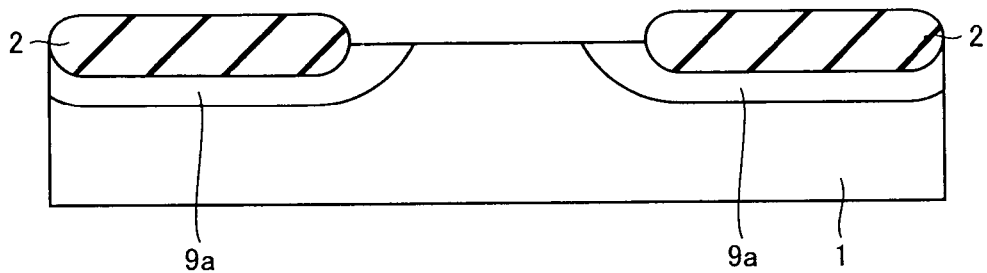

Next, referring to FIGS. 11 to 13, a semiconductor device in Embodiment 5 and a manufacturing method of the same will be described. As shown in FIG. 11, in the solid-state image pickup element of the present embodiment, field oxide film 2 is formed in the vicinity of the main surface of P-type semiconductor substrate 1. A region surrounded by field oxide film 2 is provided as an element forming region.

In the element forming region, N-type impurity diffusion region 5 is formed. In addition, a P⁺ type impurity diffusion region 9a is formed along the lower surface of field oxide film 2 to a prescribed depth from the lower surface of the same. Further, P⁺ type impurity diffusion region 9a contacts bird's beak portion 2a, which is the end portion of field oxide film 2.

According to the semiconductor device of the present embodiment as described above, the PN junction is formed along an interface between N-type impurity diffusion region 5 and P-type semiconductor substrate 1 and an interface between N-type impurity diffusion region 5 and P⁺ type impurity diffusion region 9a, respectively. In other words, the PN junction is formed so as to include the interface between N-type impurity diffusion region 5 and P-type semiconductor substrate 1 and the interface between N-type impurity diffusion region 5 and P⁺ type impurity diffusion region 9a, respectively.

Therefore, depletion layer 10 formed in the PN junction does not reach the interface level present portion formed under bird's beak portion 2a. Consequently, an occurrence of the leakage current caused by the interface level present portion undesirably included in depletion layer 10 is prevented, as in the semiconductor device in Embodiments 1 to 4. Thus, the performance of the solid-state image pickup element is improved.

Next, the manufacturing method of the solid-state image pickup element of the present embodiment will be described. In the manufacturing method of the solid-state image pickup element of the present embodiment, initially, an underlying oxide film with a film thickness of 100 Å is formed on the main surface of P-type semiconductor substrate 1. Then, a silicon nitride film is formed on the underlying oxide film. Thereafter, resist film 3 is formed on the silicon nitride film. Next, using resist film 3, the silicon nitride film and the underlying oxide film are etched to form a silicon nitride film 8 and an underlying oxide film 7, as shown in FIG. 12.

Next, using resist film 3, silicon nitride film 8 and underlying oxide film 7 as a mask, the P$^+$ impurity is injected to the main surface of P-type semiconductor substrate 1. Here, the impurity is diagonally injected so as to be introduced into a region under underlying oxide film 7. Thus, P$^+$ type impurity diffusion region 9 as shown in FIG. 12 is obtained. Resist film 3 is then removed.

Thereafter, using underlying oxide film 7 and silicon nitride film 8 as a mask, P-type semiconductor substrate 1 is subjected to thermal oxidation, to form field oxide film 2. Accordingly, as shown in FIG. 13, a configuration is obtained, in which impurity diffusion region 9a is formed along the lower surface of field oxide film 2. Next, using field oxide film 2 as a mask, the N-type impurity is injected to the main surface of semiconductor substrate 1. Thus, N-type impurity diffusion region 5 is formed as shown in FIG. 11.

Here, though the N-type impurity is also injected to P$^+$ type impurity diffusion region 9a, P$^+$ type impurity diffusion region 9a maintains P-type because of the high density of the P-type impurity thereof.

Embodiment 6

Next, referring to FIG. 14, a semiconductor device in Embodiment 6 and a manufacturing method of the same will be described. In the solid-state image pickup element of Embodiment 6, field oxide film 2 is formed in the vicinity of the main surface of P-type semiconductor substrate 1. Bird's beak portion 2a is formed in the end portion of field oxide film 2. On the lower surface of bird's beak portion 2a, the interface level is produced, which is shown with a cross mark (x) in FIG. 14.

In addition, a polycrystalline silicon film 11 serving as a gate electrode is formed in the vicinity of opposing ends of the element forming region respectively so as to cover the end portion of element isolation insulating film 2 and the element forming region. On P-type semiconductor substrate 1 exposed in an opening of polycrystalline silicon film 11, N-type impurity diffusion region 5 is formed to a prescribed depth from the main surface thereof.

In the solid-state image pickup element as described above, depletion layer 10 is formed along the PN junction, which is an interface between N-type impurity diffusion region 5 and P-type semiconductor substrate 1. Width t of depletion layer 10 is smaller than distance X between a tip end of bird's beak portion 2a and intersection of the PN junction with the main surface of P-type semiconductor substrate 1.

Here, assuming that the impurity density of N-type impurity diffusion region 5 is $N_d$ and the impurity density of P-type semiconductor substrate 1 is $N_a$, width t of depletion layer 10 is calculated with the following equation, using vacuum dielectric constant $\epsilon_o$, relative dielectric constant of silicon $\epsilon_{Si}$, quantity of electric charge q, Boltzmann constant k and absolute temperature T.

$$t = \sqrt{(2\epsilon_0 \cdot \epsilon_{Si}/q) \cdot ((Na+Nd)/Na \cdot Nd) \cdot (kT/q) \cdot \ln(Nd/Na)} \qquad \text{Equation 1}$$

Therefore, even if depletion layer 10 is formed during operation of the solid-state image pickup element, depletion layer 10 does not reach a portion where the interface level is produced under bird's beak portion 2a. Consequently, as in the semiconductor device in the above Embodiments 1 to 5, the leakage current due to the interface level of bird's beak portion 2a of field oxide film 2 is prevented, and the performance of the solid-state image pickup element is improved.

Here, in the manufacturing method of the semiconductor device in the present embodiment, not only an impurity is injected to polycrystalline silicon film 11 serving as the gate electrode, but also the N-type impurity is injected to P-type semiconductor substrate 1 for forming N-type impurity diffusion region 5.

Embodiment 7

Next, referring to FIG. 15, a semiconductor device in Embodiment 7 and a manufacturing method of the same will be described.

Figure 14:
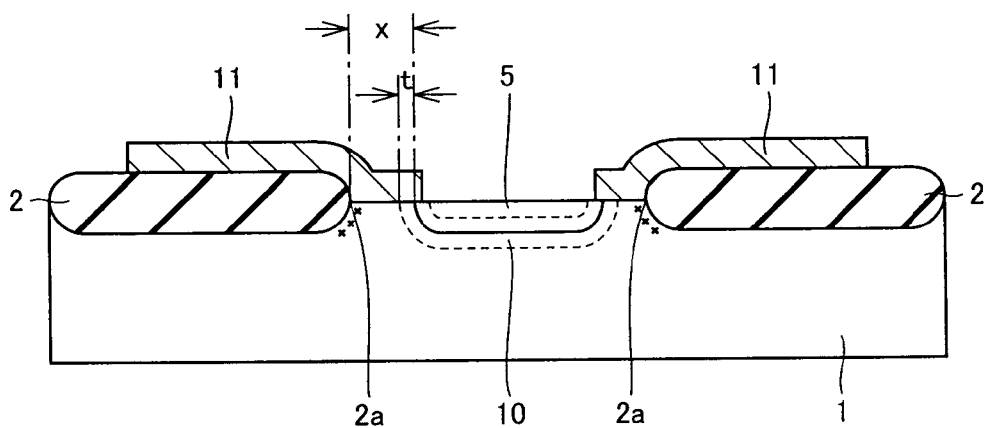
FIG. 14 illustrates a configuration and a manufacturing method of a semiconductor device in Embodiment 6.
Figure 15:
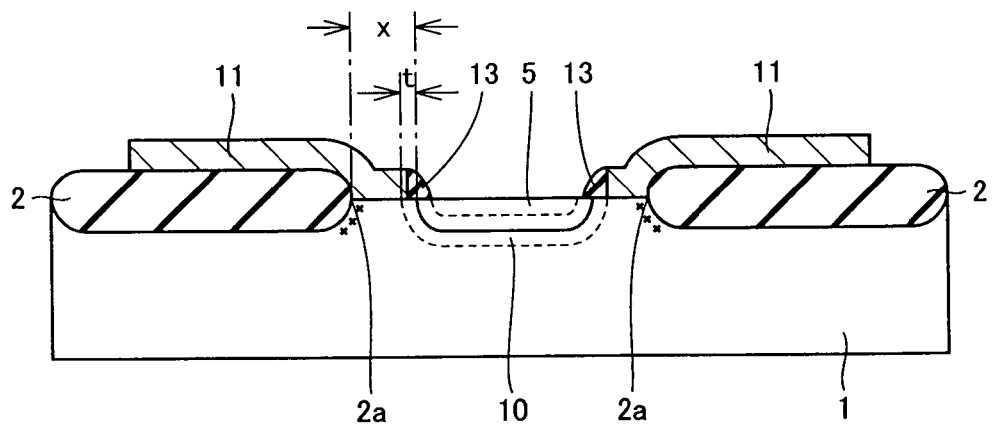
FIG. 15 illustrates a configuration and a manufacturing method of a semiconductor device in Embodiment 7.

The solid-state image pickup element of Embodiment 7 shown in FIG. 15 is different from the configuration of the semiconductor device in Embodiment 6 shown in FIG. 14 in that a sidewall insulating film 13 is formed in the end portion on an element forming region side of polycrystalline silicon film 11. In the solid-state image pickup element in the present embodiment as well, depletion layer 10 does not reach the interface level present portion. Therefore, as in the solid-state image pickup element in the above Embodiments 1 to 6, the leakage current produced on the lower surface of field oxide film 2 is prevented, and the performance of the solid-state image pickup element is improved.

Here, in the manufacturing method of the solid-state image pickup element shown in FIG. 15, not only an impurity is injected to polycrystalline silicon film 11 serving as the gate electrode, but also the N-type impurity is injected to P-type semiconductor substrate 1 for forming N-type impurity diffusion region 5, using sidewall insulating film 13 as a mask.

Embodiment 8

Next, referring to FIG. 16, a semiconductor device in Embodiment 8 and a manufacturing method of the same will be described.

In the solid-state image pickup element of the present embodiment, field oxide film 2 is formed in the vicinity of the main surface of P-type semiconductor substrate 1. Bird's beak portion 2a is formed in the end portion of field oxide film 2. A polycrystalline silicon film 12 is formed on field oxide film 2. In the element forming region surrounded by field oxide film 2, N-type impurity diffusion region 5 is formed to a prescribed depth from the main surface of P-type semiconductor substrate 1.

In addition, the PN junction formed by N-type impurity diffusion region 5 and P-type semiconductor substrate 1 is formed in the vicinity of the lower surface of field oxide film 2 further outside of bird's beak portion 2a. Therefore, even if depletion layer 10 is formed during operation of the semiconductor device, depletion layer 10 does not reach the interface level present portion produced under bird's beak portion 2a.

In other words, distance Z from an intersection of the PN junction and the lower surface of field oxide film 2 to the tip end of bird's beak portion 2a is set such that distance Y from the tip end of bird's beak portion 2a to the end portion of depletion layer 10 is larger than that from the tip end of bird's beak portion 2a to the end portion of the interface level present portion.

Therefore, in the solid-state image pickup element in the present embodiment as well, depletion layer 10 does not reach the interface level present portion. Thus, the leakage current produced on the lower surface of field oxide film 2 is prevented, and the performance of the solid-state image pickup element is improved.

Figure 16:
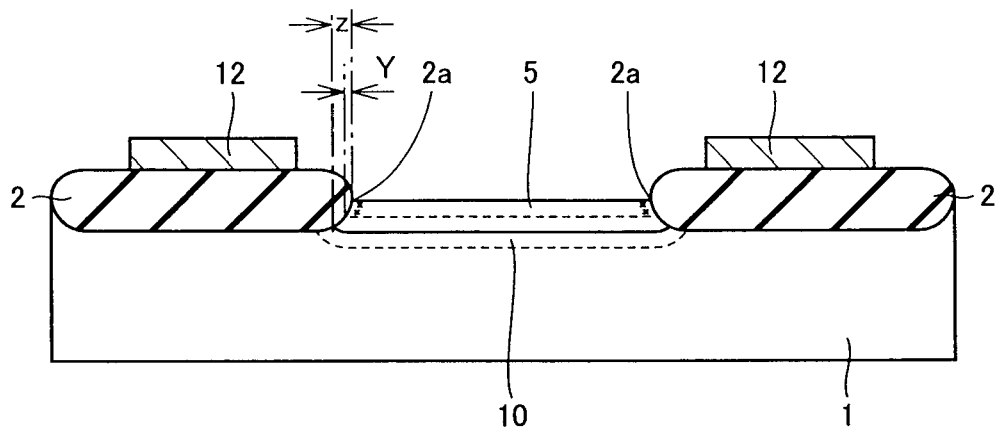
FIG. 16 illustrates a configuration and a manufacturing method of a semiconductor device in Embodiment 8.

Here, in the solid-state image pickup element having a configuration as shown in FIG. 16, the N-type impurity is injected not only to polycrystalline silicon film 12 serving as the gate electrode, but also to P-type semiconductor substrate 1. Thus, the gate electrode is formed, and the impurity penetrate thorough bird's beak portion 2a, thereby forming N-type impurity diffusion region 5 in the vicinity of bird's beak portion 2a.

Embodiment 9

Next, referring to FIG. 17, a semiconductor device in Embodiment 9 and a manufacturing method of the same will be described.

Figure 17:
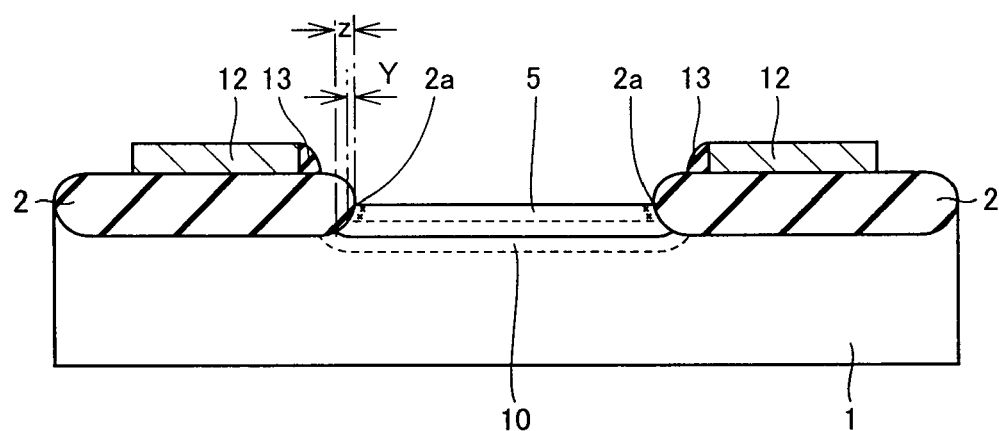
FIG. 17 illustrates a configuration and a manufacturing method of a semiconductor device in Embodiment 9.

As shown in FIG. 17, the solid-state image pickup element in the present embodiment is different from that in Embodiment 8 shown in FIG. 16 in that the sidewall insulating film is formed in the end portion on the element forming region side of polycrystalline silicon film 12.

In the solid-state image pickup element shown in FIG. 17 as well, depletion layer 10 formed by the PN junction does not reach the interface level present portion. Thus, as in the semiconductor device in the above Embodiments 1 to 8, the leakage current on the lower surface of field oxide film 2 is prevented, and the performance of the solid-state image pickup element is improved.

Here, N-type impurity diffusion region 5 of the solid-state image pickup element shown in FIG. 17 is formed in the following manner. The N-type impurity is injected not only to polycrystalline silicon film 12 serving as the gate electrode, but also to the main surface of P-type semiconductor substrate 1, using sidewall insulating film 13 as a mask. Then, the N-type impurity penetrate through the end portion of bird's beak portion 2a. Thus, a portion where the PN junction contacts field oxide film 2 goes under field oxide film 2.

Embodiment 10

Next, referring to FIG. 18, a semiconductor device in Embodiment 10 and a manufacturing method of the same will be described. In the solidstate image pickup element of the present embodiment, field oxide film 2 is formed in the vicinity of the main surface of P-type semiconductor substrate 1. A region surrounded by field oxide film 2 forms the element forming region. In addition, bird's beak portion 2a is formed in the end portion of field oxide film 2. In the vicinity of the lower surface of bird's beak portion 2a, the interface level present portion is formed.

N-type impurity diffusion region 5 is formed in a region in P-type semiconductor substrate 1, extending from the tip end of one bird's beak portion 2a to the tip end of the other bird's beak portion 2a. Under N-type impurity diffusion region 5, an N⁻ type impurity diffusion region 14 of a density lower than N-type impurity diffusion region 5 is formed. An interface between N⁻ type impurity diffusion region 14 and P-type semiconductor substrate 1 is formed along an interface between N⁻ type impurity diffusion region 14 and N-type impurity diffusion region 5.

In the solid-state image pickup element of the present embodiment, the PN junction is formed between P-type semiconductor substrate 1 and N⁻ type impurity diffusion region 14. Therefore, even if depletion layer 10 is produced by the PN junction, depletion layer 10 does not reach the interface level present portion. Thus, as in the solid-state image pickup element of the above Embodiments 1 to 9, the leakage current produced on the lower surface of field oxide film 2 is prevented, and the performance of the solid-state image pickup element is improved.

Figure 18:
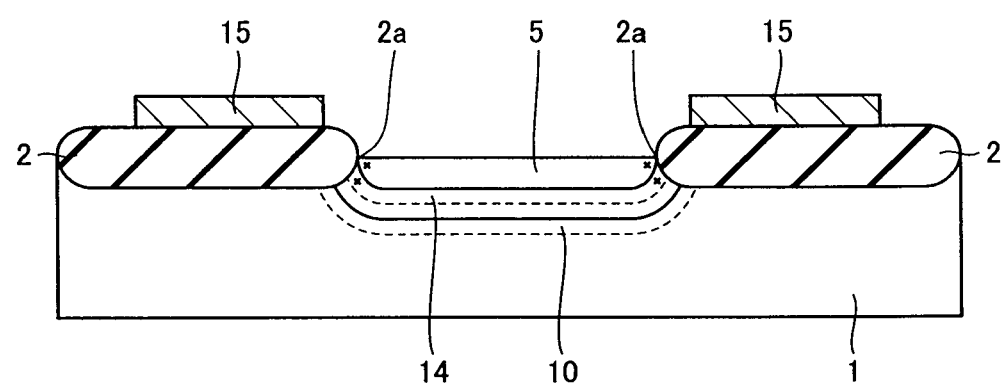
FIG. 18 illustrates a configuration and a manufacturing method of a semiconductor device in Embodiment 10.

Here, N⁻ type impurity diffusion region 14 in the semiconductor device shown in FIG. 18 is formed in the following manner. In the step of injecting the N-type impurity to a polycrystalline silicon film 15 serving as the gate electrode, an N⁻ type impurity penetrate through bird's beak portion 2a, and the N-type impurity is injected to the P-type semiconductor substrate. In addition, N-type impurity diffusion region 5 is formed by injecting the N-type impurity to the main surface of P-type semiconductor substrate 1, using field oxide film 2 as a mask.

Embodiment 11

Figure 19:
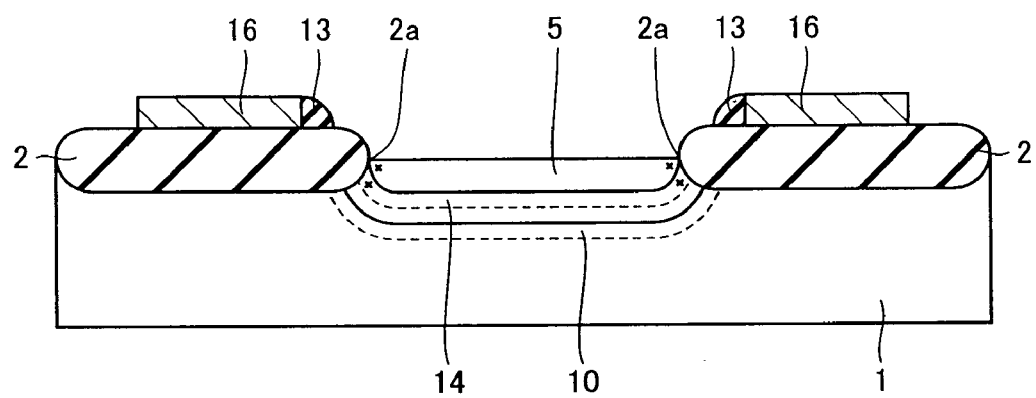
FIG. 19 illustrates a configuration and a manufacturing method of a semiconductor device in Embodiment 11.

Referring to FIG. 19, a configuration of a semiconductor device in Embodiment 11 and a manufacturing method of the same will be described.

As shown in FIG. 19, a configuration of the solid-state image pickup element in Embodiment 11 is substantially the same as that in Embodiment 10 shown with reference to FIG. 18. However, the configuration of the solid-state image pickup element in Embodiment 11 is different from that in Embodiment 10 in that it is provided with sidewall insulating film 13.

According to the solid-state image pickup element in the present embodiment as described above, as in the solid-state image pickup element in the above Embodiments 1 to 10, depletion layer 10 does not reach the interface level present portion. Therefore, the leakage current produced on the lower surface of field oxide film 2 is prevented, and the performance of the solid-state image pickup element is improved.

Here, in the manufacturing method of the solid-state image pickup element in the present embodiment, N- type impurity diffusion region 14 is formed in the following manner. In the step of injecting the N-type impurity to a polycrystalline silicon film 16 serving as the gate electrode, the N⁻ type impurity is introduced into bird's beak portion 2a using sidewall insulating film 13 as a mask, and the N-type impurity is injected to the P-type semiconductor substrate 1. In addition, N-type impurity diffusion region 5 is formed by injecting the N-type impurity to the main surface of P-type semiconductor substrate 1, using field oxide film 2 as a mask.

In the semiconductor device in each embodiment, though a field oxide film formed with LOCOS has been described as one example of the element isolation insulating film, even a trench isolation insulating film embedded in a trench formed to a prescribed depth from the main surface of semiconductor substrate 1 will attain the same effect as in the semiconductor device shown in Embodiments 1 to 11, provided that the element isolation insulating film is provided for forming an element forming region.

In addition, in the semiconductor device in Embodiments 1 to 11, an impurity diffusion region formed as a floating diffusion region has been described with an N-type impurity diffusion region. Even if the impurity diffusion region is of P-type, however, the same effect as in the semiconductor device in the above Embodiments 1 to 11 can be obtained, provided that the semiconductor device has an impurity diffusion region with P-type and N-type reversed in other component portions.

In addition, in the semiconductor device in Embodiments 1 to 11, the N-type impurity may be any impurity such as P, As or the like, while the P-type impurity may be any impurity such as B, $BF_2$ or the like.

In the description of each embodiment, each component of a semiconductor is provided with a reference character. It is noted that the components having the same reference characters are formed for the same purpose and attain the same function.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a first impurity diffusion region provided in a semiconductor substrate and including at least one impurity diffusion region having an impurity of a first conductivity type;

an element isolation insulating film provided in said first impurity diffusion region and isolating one element forming region from another element forming region;

a second impurity diffusion region provided in said first impurity diffusion region and including at least one impurity diffusion region having an impurity of a second conductivity type, the second conductivity type being opposite to the first conductivity type; and an interface level present portion in which a level is produced in an interface where said element isolation insulating film and said semiconductor substrate are in contact; wherein:

a position of an interface between said first impurity diffusion region and said second impurity diffusion region is set such that a depletion layer formed to contain the interface between said first impurity diffusion region and said second impurity diffusion region does not reach said interface level present portion;

said first impurity diffusion region includes a third impurity diffusion region having an impurity of the first conductivity type and a fourth impurity diffusion region formed between said second impurity diffusion region and said element isolation insulating film and having an impurity of the first conductivity type, of a density higher than that of said third impurity diffusion region; and a position of an interface between said second impurity diffusion region and said fourth impurity diffusion region is set such that a depletion layer formed to contain the interface between said second impurity diffusion region and said fourth impurity diffusion region does not reach said interface level present portion.

* * * * *